United States Patent
Sakurai et al.

(10) Patent No.: US 9,409,238 B2
(45) Date of Patent: Aug. 9, 2016

(54) HARD COATING FOR CUTTING TOOL, AND CUTTING TOOL COATED WITH HARD COATING

(75) Inventors: Masatoshi Sakurai, Toyokawa (JP); Takaomi Toihara, Toyokawa (JP)

(73) Assignee: OSG CORPORATION, Toyokawa-shi (JP)

( * ) Notice: Subject to any disclaimer, the term of this patent is extended or adjusted under 35 U.S.C. 154(b) by 0 days.

(21) Appl. No.: 14/389,879

(22) PCT Filed: Apr. 9, 2012

(86) PCT No.: PCT/JP2012/059738
§ 371 (c)(1),
(2), (4) Date: Oct. 1, 2014

(87) PCT Pub. No.: WO2013/153614
PCT Pub. Date: Oct. 17, 2013

(65) Prior Publication Data
US 2015/0072126 A1    Mar. 12, 2015

(51) Int. Cl.
*B23B 27/14*    (2006.01)
*B23B 51/00*    (2006.01)
(Continued)

(52) U.S. Cl.
CPC .............. *B23B 51/00* (2013.01); *C23C 14/345* (2013.01); *C23C 28/321* (2013.01); *C23C 28/34* (2013.01); *C23C 28/341* (2013.01);
(Continued)

(58) Field of Classification Search
USPC ............ 51/307, 309; 428/216, 336, 469, 472, 428/698, 699, 701, 702, 704
See application file for complete search history.

(56) References Cited

U.S. PATENT DOCUMENTS 5,268,216 A * 12/1993 Keem .................. C10M 103/00
428/472
5,851,687 A    12/1998 Ljungberg
(Continued)

FOREIGN PATENT DOCUMENTS

CN    1107901 A    9/1995
CN    1211284 A    3/1999
(Continued)

OTHER PUBLICATIONS

Jun. 26, 2012 International Search Report issued in International Application No. PCT/JP2012/059738.
(Continued)

*Primary Examiner* — Archene Turner
(74) *Attorney, Agent, or Firm* — Oliff PLC

(57) ABSTRACT

A hard coating for a cutting tool being highly resistant to both wear and seizure; and a cutting tool coated with the hard coating. This hard coating is a multilayer film including two or more of the following layered in alternation: first coating layers including $Ag_aCu_{1-a}$; and second coating layers including a nitride, oxide, carbide, carbonitride, or boride containing at least one element selected from among group IVA, VA, and VIA elements, aluminum, and silicon. Since the atomic proportion for the first coating layers is between 0.2 and 0.4, inclusive, the layering pitch of the first and second coating layers is between 0.2 and 100 nm, inclusive, and the total thickness is between 0.2 and 10.0 μm, inclusive, the coefficient of friction and cutting resistance can be reduced by the inclusion of silver in the coating, and provide a hard coating that exhibits superb lubricity and resistance to seizure.

4 Claims, 4 Drawing Sheets

(51) Int. Cl.
*C23C 30/00* (2006.01)
*C23C 14/34* (2006.01)
*C23C 28/00* (2006.01)

(52) U.S. Cl.
CPC ............ *C23C 28/3455* (2013.01); *C23C 28/42* (2013.01); *C23C 30/005* (2013.01); *B23B 2222/04* (2013.01); *B23B 2222/76* (2013.01); *C22C 2204/00* (2013.01); *Y10T 428/24975* (2015.01)

(56) References Cited

U.S. PATENT DOCUMENTS

| | | | |
|---|---|---|---|
| 5,948,548 A * | 9/1999 | Welty | ............... C23C 28/321 428/623 |
| 5,980,988 A | 11/1999 | Ljungberg | |
| 6,299,658 B1 | 10/2001 | Moriguchi et al. | |
| 6,469,278 B1 | 10/2002 | Boyce | |
| 6,489,036 B1 * | 12/2002 | Sherman | ............... A47F 5/0006 428/469 |
| 7,799,420 B2 | 9/2010 | Beck et al. | |
| 2004/0018393 A1 | 1/2004 | Fukui et al. | |
| 2005/0011748 A1 | 1/2005 | Beck et al. | |
| 2006/0257691 A1 | 11/2006 | Trinh et al. | |
| 2007/0259204 A1 | 11/2007 | Isshiki | |
| 2008/0131219 A1 | 6/2008 | Reineck et al. | |
| 2008/0131677 A1 | 6/2008 | Reineck et al. | |
| 2008/0254282 A1 | 10/2008 | Kukino et al. | |
| 2010/0086370 A1 | 4/2010 | Nagano et al. | |
| 2010/0101866 A1 | 4/2010 | Bird | |
| 2010/0304171 A1 | 12/2010 | Tomantschger et al. | |
| 2011/0117344 A1 | 5/2011 | Chen et al. | |
| 2011/0135898 A1 | 6/2011 | Bohlmark et al. | |
| 2012/0114960 A1 | 5/2012 | Takesawa et al. | |
| 2012/0247948 A1 | 10/2012 | Shin et al. | |
| 2015/0072126 A1 | 3/2015 | Sakurai et al. | |
| 2015/0072135 A1 | 3/2015 | Sakurai et al. | |

FOREIGN PATENT DOCUMENTS

| | | | |
|---|---|---|---|
| CN | 1470350 | A | 1/2004 |
| CN | 101027425 | A | 8/2007 |
| CN | 101068759 | A | 11/2007 |
| CN | 101557897 | A | 10/2009 |
| CN | 102091923 | A | 6/2011 |
| JP | A-6-23601 | | 2/1994 |
| JP | H06-23601 | | 2/1994 |
| JP | A-10-249609 | | 9/1998 |
| JP | A-2003-105565 | | 4/2003 |
| JP | 2005-500440 | A | 1/2005 |
| JP | 2005-138209 | A | 6/2005 |
| JP | 2005256095 | A | 9/2005 |
| JP | 2008/100345 | A | 5/2008 |
| JP | A-2010-76082 | | 4/2010 |
| JP | 2011156645 | A | 8/2011 |
| JP | 2011-240438 | A | 12/2011 |
| WO | 2004/035864 | A2 | 4/2004 |
| WO | 2010/150411 | A1 | 12/2010 |
| WO | 2011/002008 | A1 | 1/2011 |
| WO | 2011062450 | A2 | 5/2011 |

OTHER PUBLICATIONS

Castanho, J.M. et al. "Towards an Improvement of Performance of TiAlN Hard Coatings Using Metal Interlayers". Mat. Res. Soc. Symp. Proc. vol. 750, pp. 1-5, 2003.
Aug. 24, 2015 Office Action issued in Chinese Patent Application No. 201280072030.2.
Wang, X.Q. et al., "Deposition, structure and hardness of Ti—Cu—N hard films prepared by pulse biased arc ion plating," Elsevier, vol. 86, (2011), pp. 415-421.
Musil, J., "Hard and superhard nanocomposite coatings," Elsevier, Surface and Coatings Technology, vol. 125, (2000), pp. 322-330.
Nov. 12, 2015 Office Action issued in Korean Patent Application No. 10-2014-7028617.
Nov. 23, 2015 Extended Search Report issued in European Patent Application No. 12873507.3.
Jan. 12, 2016 Office Action issued in Japanese Patent Application No. 2014-508945.
Jun. 26, 2012 International Search Report issued in International Patent Application No. PCT/JP2012/059012.
Feb. 18, 2016 Office Action issued in U.S. Appl. No. 14/389,929.

* cited by examiner

FIG.5

| TEST PRODUCT | LOWERMOST LAYER | UPPERMOST LAYER | LAYER A | LAYER B | FILM THICKNESS (nm) LAYER A | FILM THICKNESS (nm) LAYER B | LAMINATION CYCLE (nm) | LAYER NUMBER | TOTAL FILM THICKNESS (μm) | MACHINED HOLE NUMBER | JUDGMENT |
|---|---|---|---|---|---|---|---|---|---|---|---|
| INVENTIVE PRODUCT 1 | LAYER A | LAYER B | Ag0.2 Cu0.8 | TiN | 0.1 | 0.1 | 0.2 | 2000 | 0.2 | 24 | ACCEPTED |
| INVENTIVE PRODUCT 2 | LAYER A | LAYER B | Ag0.3 Cu0.7 | CrN | 5.0 | 10.0 | 15.0 | 400 | 3.0 | 36 | ACCEPTED |
| INVENTIVE PRODUCT 3 | LAYER A | LAYER B | Ag0.4 Cu0.6 | NbN | 25.0 | 75.0 | 100.0 | 200 | 10.0 | 30 | ACCEPTED |
| INVENTIVE PRODUCT 4 | LAYER A | LAYER B | Ag0.4 Cu0.6 | AlN | 0.5 | 36.5 | 37.0 | 150 | 2.8 | 41 | ACCEPTED |
| INVENTIVE PRODUCT 5 | LAYER A | LAYER B | Ag0.2 Cu0.8 | SiN | 1.0 | 3.0 | 4.0 | 3200 | 6.4 | 34 | ACCEPTED |
| INVENTIVE PRODUCT 6 | LAYER A | LAYER B | Ag0.3 Cu0.7 | ZrVO | 51.0 | 2.5 | 53.5 | 180 | 4.8 | 32 | ACCEPTED |
| INVENTIVE PRODUCT 7 | LAYER A | LAYER B | Ag0.4 Cu0.6 | MoSiC | 9.0 | 22.0 | 31.0 | 70 | 1.1 | 27 | ACCEPTED |
| INVENTIVE PRODUCT 8 | LAYER A | LAYER B | Ag0.2 Cu0.8 | HfTaCN | 12.0 | 0.6 | 12.6 | 110 | 0.7 | 31 | ACCEPTED |
| INVENTIVE PRODUCT 9 | LAYER A | LAYER B | Ag0.4 Cu0.6 | TiAlCrVSiB | 7.0 | 0.1 | 7.1 | 550 | 2.0 | 25 | ACCEPTED |
| INVENTIVE PRODUCT 10 | LAYER A | LAYER A | Ag0.3 Cu0.7 | TiAlN | 90.0 | 5.0 | 95.0 | 33 | 1.6 | 33 | ACCEPTED |
| INVENTIVE PRODUCT 11 | LAYER B | LAYER B | Ag0.3 Cu0.7 | AlCrSiCN | 3.2 | 12.5 | 15.7 | 445 | 3.5 | 23 | ACCEPTED |
| INVENTIVE PRODUCT 12 | LAYER B | LAYER A | Ag0.4 Cu0.6 | ZrNbB | 0.1 | 0.1 | 0.2 | 2000 | 0.2 | 36 | ACCEPTED |
| INVENTIVE PRODUCT 13 | LAYER B | LAYER A | Ag0.4 Cu0.6 | TiSiO | 5.0 | 0.1 | 5.1 | 3200 | 8.2 | 35 | ACCEPTED |
| INVENTIVE PRODUCT 14 | LAYER B | LAYER A | Ag0.2 Cu0.8 | TiWC | 0.3 | 0.3 | 0.6 | 6300 | 1.9 | 25 | ACCEPTED |

FIG.6

| TEST PRODUCT | LOWERMOST LAYER | UPPERMOST LAYER | LAYER A | LAYER B | FILM THICKNESS (nm) LAYER A | FILM THICKNESS (nm) LAYER B | LAMINATION CYCLE (nm) | LAYER NUMBER | TOTAL FILM THICKNESS (μm) | MACHINED HOLE NUMBER | JUDGMENT |
|---|---|---|---|---|---|---|---|---|---|---|---|
| TEST PRODUCT 1 | LAYER A | LAYER B | Ag0.1 Cu0.9 | TiAlN | 2.0 | 1.0 | 3.0 | 1900 | 2.9 | 13 | REJECTED |
| TEST PRODUCT 2 | LAYER A | LAYER B | Ag0.5 Cu0.5 | ZrVMoSiO | 62.0 | 33.0 | 95.0 | 120 | 5.7 | 17 | REJECTED |
| TEST PRODUCT 3 | LAYER A | LAYER B | Ag0.3 Cu0.7 | HfCrCN | 0.05 | 0.05 | 0.1 | 3000 | 0.2 | 6 | REJECTED |
| TEST PRODUCT 4 | LAYER A | LAYER B | Ag0.2 Cu0.8 | AlCrN | 80.0 | 21.0 | 101.0 | 6 | 0.3 | 9 | REJECTED |
| TEST PRODUCT 5 | LAYER A | LAYER B | Ag0.3 Cu0.7 | TiMoB | 21.0 | 34.0 | 55.0 | 366 | 10.1 | 11 | REJECTED |
| TEST PRODUCT 6 | LAYER A | LAYER A | Ag0.1 Cu0.9 | TaN | 2.8 | 3.3 | 6.1 | 401 | 1.2 | 8 | REJECTED |
| TEST PRODUCT 7 | LAYER B | LAYER B | Ag0.5 Cu0.5 | MoSiC | 11.0 | 18.0 | 29.0 | 521 | 7.6 | 18 | REJECTED |
| TEST PRODUCT 8 | LAYER B | LAYER A | Ag0.4 Cu0.6 | AlN | 0.05 | 0.05 | 0.1 | 3000 | 0.15 | 5 | REJECTED |
| TEST PRODUCT 9 | LAYER B | LAYER A | Ti0.4 B0.6 ON | TiAlCrVSiB | 19.0 | 21.0 | 40.0 | 504 | 10.1 | 14 | REJECTED |

HARD COATING FOR CUTTING TOOL, AND
CUTTING TOOL COATED WITH HARD
COATING

TECHNICAL FIELD

The present invention relates to a cutting tool hard film disposed as coating on a surface of a cutting tool and a hard film coated cutting tool provided with the hard film and particularly to an improvement for increasing both abrasion resistance and welding resistance.

BACKGROUND ART

Cutting tools such as drills and taps are provided and coated with a hard film to increase abrasion resistance. TiN-based, TiCN-based, TiAlN-based and AlCrN-based coatings are widely used for this cutting tool hard film and improvements are achieved for further increasing performance thereof. For example, this corresponds to a hard laminated film described in Patent Document 1.

PRIOR ART DOCUMENT

Patent Document

Patent Document 1: Japanese Laid-Open Patent Publication No. 2010-76082

SUMMARY OF THE INVENTION

Problem to be Solved by the Invention

However, a cutting tool with a hard film formed by the conventional technique as described above may have insufficient welding resistance at the time of cutting depending on a type of work material and a cutting condition. Therefore, a tool life may be shortened due to welding of work material etc., and room for improvement exists. Therefore, it is requested to develop a cutting tool hard film and a hard film coated cutting tool excellent in both abrasion resistance and welding resistance.

The present invention was conceived in view of the situations and it is therefore an object of the present invention to provide a cutting tool hard film and a hard film coated cutting tool excellent in both abrasion resistance and welding resistance.

Means for Solving the Problem

To achieve the object, the first aspect of the invention provides a cutting tool hard film disposed as coating on a surface of a cutting tool, wherein the cutting tool hard film is a multilayer film having a first film layer comprising $Ag_aCu_{1-a}$, and a second film layer comprising nitride, oxide, carbide, carbonitride, or boride containing at least one element out of group IVa elements, group Va elements, group VIa elements, Al, and Si alternately laminated in two or more layers, wherein an atom ratio a related to the first film layer is within a range of 0.2 or more and 0.4 or less, wherein a lamination cycle of the first film layer and the second film layer is within a range of 0.2 nm or more and 100 nm or less, and wherein a total film thickness is within a range of 0.2 µm or more and 10.0 µm or less.

Effects of the Invention

As described above, according to the first aspect of the invention, the cutting tool hard film is a multilayer film having a first film layer comprising $Ag_aCu_{1-a}$, and a second film layer comprising nitride, oxide, carbide, carbonitride, or boride containing at least one element out of group IVa elements, group Va elements, group VIa elements, Al, and Si alternately laminated in two or more layers, an atom ratio a related to the first film layer is within a range of 0.2 or more and 0.4 or less, a lamination cycle of the first film layer and the second film layer is within a range of 0.2 nm or more and 100 nm or less, and a total film thickness is within a range of 0.2 µm or more and 10.0 µm or less; therefore, since Ag is contained in the film, friction coefficient and cutting resistance can be reduced; and a high hardness film excellent in lubricity and welding resistance can be provided. Thus, a cutting tool hard film excellent in both abrasion resistance and welding resistance can be provided.

The second aspect of the invention which depends from the first aspect of the invention provides a hard film coated cutting tool having the cutting tool hard film recited in the first aspect of the invention disposed as coating on a surface. Consequently, since Ag is contained in the film, friction coefficient and cutting resistance can be reduced, and a high hardness film excellent in lubricity and welding resistance is acquired. Thus, a hard film coated cutting tool excellent in both abrasion resistance and welding resistance can be provided.

BRIEF DESCRIPTION OF THE DRAWINGS

FIG. 5 is a diagram of coating structures of samples corresponding to the embodiment of the present invention used in a drilling test conducted by the present inventors for verifying an effect of the present invention, and also indicates respective test results.

FIG. 6 is a diagram of coating structures of test products for comparison used in a drilling test conducted by the present inventors for verifying an effect of the present invention, and also indicates respective test results.

MODE FOR CARRYING OUT THE INVENTION

Figure 1:
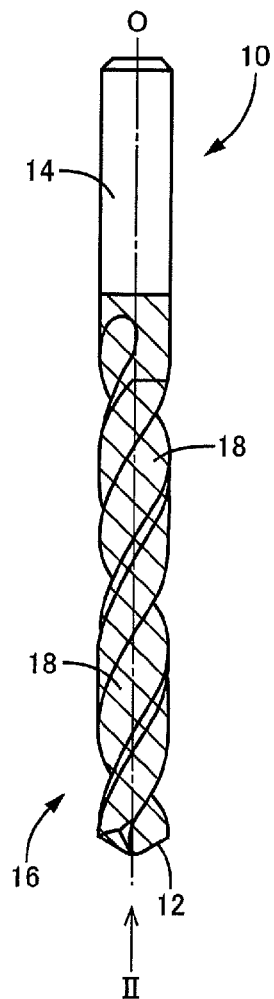
FIG. 1 is a diagram of a drill that is an embodiment of a hard film coated cutting tool of the present invention and is a front view from a direction orthogonal to an axial center.

A cutting tool hard film of the present invention is preferably applied to surface coating of various cutting tools including rotary cutting tools such as end mills, drills, face mills, forming mills, reamers, and taps, as well as non-rotary cutting tools such as tool bits. Although cemented carbide and high speed tool steel are preferably used as tool base material, i.e., material of a member provided with the hard film, other materials are also available and, for example, the cutting tool hard film of the present invention is widely applied to cutting tools made of various materials such as cermet, ceramics, polycrystalline diamond, single-crystal diamond, polycrystalline CBN, and single-crystal CBN.

The cutting tool hard film of the present invention is disposed as coating on a portion or the whole of the surface of a cutting tool and is preferably disposed on a cutting portion involved with cutting in the cutting tool. More preferably, the cutting tool hard film is disposed to coat at least a cutting edge or a rake surface in the cutting portion.

The second film layer is made of nitride, oxide, carbide, carbonitride, or boride containing at least one element out of group IVa elements, group Va elements, group VIa elements, Al, and Si, or mutual solid solution thereof. Specifically, the second film layer comprises TiN, TiAlN, TiAlCrVSiB, TiSiO, TiWC, ZrVO, ZrNbB, HfTaCN, NbN, CrN, MoSiC, AlN, AlCrSiCN, SiN, etc.

Film thicknesses of the first film layer and the second film layer are respectively defined depending on composition etc., and if pluralities of the layers are repeatedly laminated, the respective film thicknesses may be constant or may be changed continuously or stepwise. Although average film thicknesses of the first film layers and the second film layers vary depending on a member to be coated, composition of the film, etc., appropriate average film thicknesses are within a range of about 0.1 to 90 nm, for example.

Although the first and second film layers are preferably disposed by, for example, a PVD method such as an arc ion plating method, an ion beam deposition method, a sputtering method, a PLD (Pulse Laser Deposition) method, and an IBAD (Ion Beam Assisted Deposition) method, other film formation methods are also employable.

Embodiment

A preferred embodiment of the present invention will now be described in detail with reference to the drawings. In the drawings used in the following description, portions are not necessarily precisely depicted in terms of dimension ratio, etc.

Figure 2:
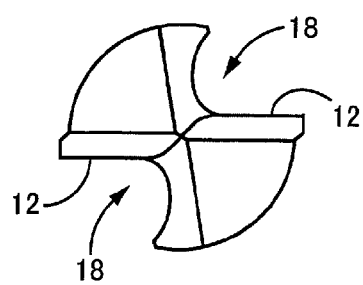
FIG. 2 is an enlarged bottom view of the drill depicted in FIG. 1 viewed from a tip disposed with a cutting edge.

FIG. 1 is a diagram of a drill 10 that is an embodiment of a hard film coated cutting tool of the present invention and is a front view from a direction orthogonal to an axial center O. FIG. 2 is an enlarged bottom view of the drill 10 depicted in FIG. 1 viewed from a tip disposed with a cutting edge 12 (i.e., a direction indicated by an arrow II). The drill 10 of this embodiment depicted in FIGS. 1 and 2 is a two-flute twist drill and integrally includes a shank 14 and a body 16 in the axial center O direction. The body 16 has a pair of flutes 18 twisted clockwise around the axial center O. The tip of the body 16 is provided with a pair of the cutting edges 12 corresponding to the pair of the flutes 18 and, when the drill 10 is rotationally driven clockwise around the axial center O in a view from the shank 14, a hole is cut in work material by the cutting edges 12 while chips generated at the time of cutting of the hole are discharged through the flutes 18 toward the shank 14.

Figure 3:
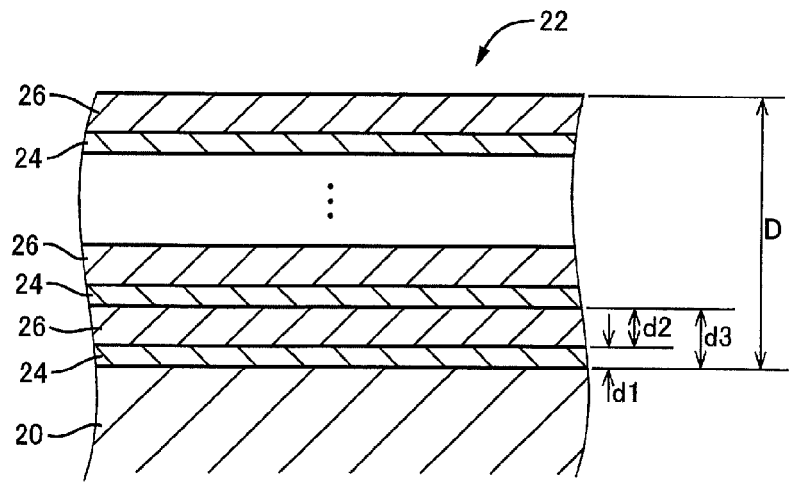
FIG. 3 is an enlarged cross-sectional view around a surface of a body of the drill of FIG. 1, exemplarily illustrating a configuration of a hard film that is an embodiment of a cutting tool hard film of the present invention.

FIG. 3 is an enlarged cross-sectional view around a surface of the body 16 of the drill 10, exemplarily illustrating a configuration of a hard film 22 that is an embodiment of the cutting tool hard film of the present invention. The drill 10 is formed by coating a surface of a tool base material (tool parent material) 20 made of high speed tool steel (high-speed steel) with the hard film 22 depicted in FIG. 3. For example, as depicted in FIG. 3, the hard film 22 is a multilayer film having first film layers 24 and second film layers 26 laminated alternately in two or more layers on the surface of the tool base material 20. FIG. 3 depicts an example in which the first film layer 24 and the second film layer 26 form a lowermost layer disposed on the surface of the tool base material 20 and an uppermost layer corresponding to a surface (outer surface) of the hard film 22, respectively; however, the second film layer 26 and the first film layer 24 may form the lowermost layer and the uppermost layer, respectively.

The first film layer 24 comprises $Ag_aCu_{1-a}$ containing unavoidable impurities. An atom ratio (mixed crystal ratio) a related to the first film layer 24 is within a range of 0.2 or more and 0.4 or less ($0.2 \leq a \leq 0.4$). The second film layer 26 consists of nitride, oxide, carbide, carbonitride, or boride containing at least one element out of group IVa elements, group Va elements, group VIa elements, Al, and Si, or mutual solid solution thereof, and contains unavoidable impurities. Specifically, the second film layer 26 comprises TiN, TiAlN, TiAlCrVSiB, TiSiO, TiWC, ZrVO, ZrNbB, HfTaCN, NbN, CrN, MoSiC, AlN, AlCrSiCN, SiN, etc.

The hard film 22 preferably has the first film layers 24 and the second film layers 26 formed with respective predefined constant film thicknesses (average film thicknesses). Although the respective average film thicknesses of the first film layers 24 and the second film layers 26 are separately set depending on a member to be coated, composition of the film, etc., preferably, an average film thickness d1 of the first film layers 24 and an average film thickness d2 of the second film layers 26 are appropriately defined within ranges of 0.1 to 90.0 nm and 0.1 to 75.0 nm, respectively. A lamination cycle d3 of the first film layer 24 and the second film layer 26 is within a range of 0.2 nm or more and 100 nm or less. The number of laminated layers of the first film layers 24 and the second film layers 26 (the total layer number of the first film layers 24 and the second film layers 26) is preferably within a range of 30 to 6300, Therefore, the respective layer numbers of the first film layers 24 and the second film layers 26 are preferably within a range of 15 to 3150. A total film thickness D of the hard film 22 is within a range of 0.2 μm or more and 10.0 μm or less.

Figure 4:
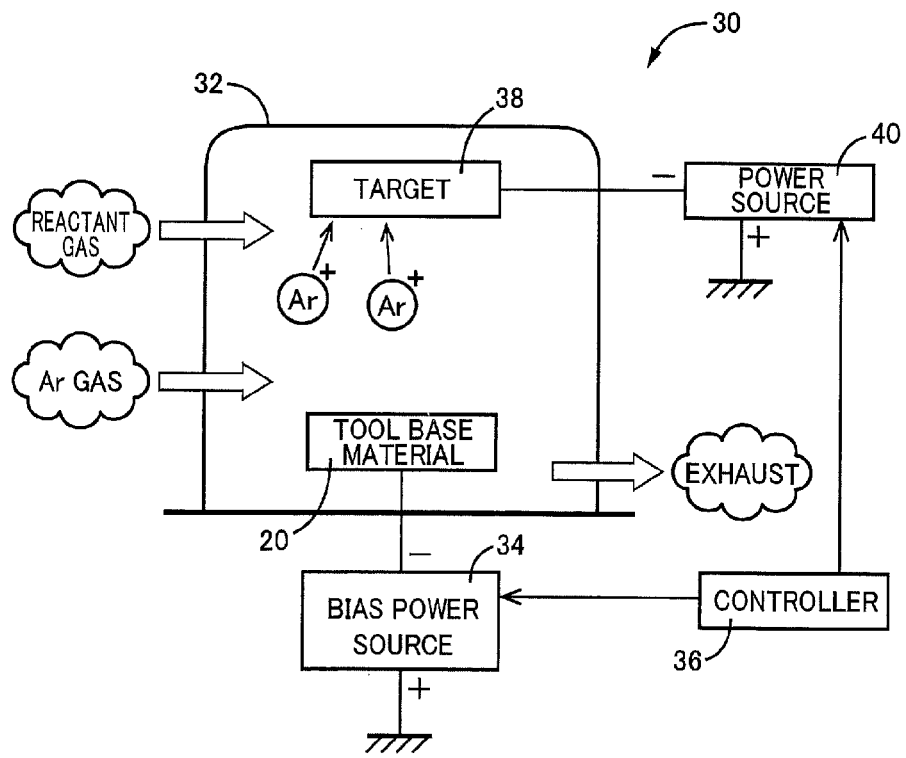
FIG. 4 is a diagram for explaining an example of a coating method of the hard film of FIG. 3.

FIG. 4 is a diagram for explaining an example of a coating method of the hard film 22. Coating of the hard film 22 on the drill 10 etc. is performed by using, for example, a sputtering apparatus 30 as depicted in FIG. 4 under control of a controller 36. Preferably, first, in an etching process used as pretreatment, a negative bias voltage is applied by a bias power source 34 to the tool base material 20 placed in a chamber 32 of the sputtering apparatus 30. This causes positive argon ions $Ar^+$ to collide with the tool base material 20 and the surface of the tool base material 20 is roughened.

Subsequently, the first film layer 24 and the second film layer 26 are alternately formed on the surface of the tool base material 20 in a sputtering process. For example, in formation of the second film layer 26, a constant negative bias voltage (e.g., about −50 to −60 V) is applied by a power source 40 to a target 38 such as TiAl making up the second film layer 26 while a constant negative bias voltage (e.g., about −100 V) is applied by the bias power source 34 to the tool base material 20 so as to cause the argon ions $Ar^+$ to collide with the target 38, thereby beating out constituent material such as TiAl. Reactant gas such as nitrogen gas ($N_2$) and hydrocarbon gas ($CH_4$, $C_2H_2$) is introduced into the chamber 32 at predetermined flow rates in addition to argon gas, and nitrogen atoms N and carbon atoms C combine with TiAl etc. beaten out from the target 38 to form TiAlN etc., which are attached as the second film layer 26 etc. in the hard film 22 to the surface of the tool base material 20. Alternatively, targets may be formed for respective elementary substances such as Ti, Al, and the sputtering may be performed by using the multiple targets at the same time to form the second film layer 26 comprising TiAlN etc. In the sputtering step, a positive voltage may be applied to the tool base material 20. By alternately attaching the first film layer 24 and the second film layer 26 to the surface of the tool base material 20 as described above, the hard film 22 is formed on the surface of the tool base material 20.

A drilling test conducted by the present inventors for verifying an effect of the present invention will then be described.

FIGS. 5 and 6 are diagrams of coating structures of inventive products and test products used in this test and respective test results (machined hole numbers and judgments). FIG. 5 depicts structures and test results of inventive products 1 to 14 corresponding to the embodiment of the present invention and FIG. 6 depicts structures and test results of test products 1 to 9 corresponding to a conventional technique for comparison. The present inventors created inventive products 1 to 14 and test products 1 to 9 as samples by coating cemented carbide drills having a tool diameter of 8.3 mmφ with hard films having respective film structures and film thicknesses depicted in FIGS. 5 and 6 and conducted a cutting test for each of the test products under the following cutting conditions. The inventive products 1 to 14 depicted in FIG. 5 correspond to inventive products to which the hard film 22 of this embodiment is applied and the test products 1 to 9 depicted in FIG. 6 correspond to non-inventive products to which a hard film not satisfying the requirement of the present invention (out of the requirement of claim 1) is applied. "Layer A" and "Layer B" of FIGS. 5 and 6 correspond to the first film layer 24 and the second film layer 26, respectively. The machined hole number depicted in FIGS. 5 and 6 is the hole number when a flank wear width is 0.2 mm and an acceptance criterion is the machined hole number equal to or greater than 20 when the flank wear width is 0.2 mm.

[Machining Conditions]

Tool shape: φ8.3 cemented carbide drill
Work material: Inconel (registered trademark) 718
Cutting machine: vertical type M/C
Cutting speed: 10 m/min
Feed speed: 0.1 mm/rev
Machining depth: 33 mm (blind)
Step amount: non-step
Cutting oil: oil-based As depicted in FIG. 5, all the inventive products 1 to 14 include multilayer films having the first film layers (layers A) 24 comprising $Ag_aCu_{1-a}$ and the second film layers (layers B) 26 comprising nitride, oxide, carbide, carbonitride, or boride containing at least one element out of group IVa elements, group Va elements, group VIa elements, Al, and Si alternately laminated in two or more layers; the atom ratio a related to the first film layer 24 is within a range of 0.2 or more and 0.4 or less; the lamination cycle d3 of the first film layer 24 and the second film layer 26 is within a range of 0.2 nm or more and 100 nm or less; and the total film thickness D is within a range of 0.2 μm or more and 10.0 μm or less. Therefore, the hard film 22 satisfying the requirement of claim 1 of the present invention is applied. As apparent from the test results depicted in FIG. 5, the acceptance criterion is satisfied by the inventive products 1 to 14 to which the hard film 22 of the embodiment is applied since all the samples have the machined hole numbers equal to or greater than 20 when the flank wear width is 0.2 mm.

Particularly, the inventive product 4 has the first film layer 24 comprising $Ag_{0.4}Cu_{0.6}$, the second film layers 26 comprising AlN, the average film thickness of 0.5 nm for the first film layers 24, the average film thickness of 36.5 nm for the second film layers 26, the lamination cycle of 37.0 nm, the layer number of 150, and the total film thickness of 2.8 μm and results in the machined hole number of 41; the inventive product 2 has the first film layer 24 comprising $Ag_{0.3}Cu_{0.7}$, the second film layers 26 comprising CrN, the average film thickness of 5.0 nm for the first film layers 24, the average film thickness of 10.0 nm for the second film layers 26, the lamination cycle of 15.0 nm, the layer number of 400, and the total film thickness of 3.0 μm and results in the machined hole number of 36; the inventive product 12 has the first film layer 24 comprising $Ag_{0.4}Cu_{0.6}$, the second film layers 26 comprising ZrNbB, the average film thicknesses of 0.1 nm for both the first film layers 24 and the second film layers 26, the lamination cycle of 0.2 nm, the layer number of 2000, and the total film thickness of 0.2 μm and results in the machined hole number of 36; the inventive product 13 has the first film layer 24 comprising $Ag_{0.4}Cu_{0.6}$, the second film layers 26 comprising TiSiO, the average film thickness of 5.0 nm for the first film layers 24, the average film thickness of 0.1 nm for the second film layers 26, the lamination cycle of 5.1 nm, the layer number of 3200, and the total film thickness of 8.2 μm and results in the machined hole number of 35: and, therefore, it can be seen that these inventive products result in the machined hole numbers equal to or greater than 35 when the flank wear width is 0.2 mm and exhibit particularly favorable cutting performance.

As depicted in FIG. 6, the test product 1 has the first film layer 24 comprising $Ag_{0.1}Cu_{0.9}$ and deviates from the requirement of claim 1 of the present invention, i.e., the atom ratio a of Ag within a range of 0.2 or more and 0.4 or less. The test product 2 has the first film layer 24 comprising $Ag_{0.5}Cu_{0.5}$ and deviates from the requirement of claim 1 of the present invention, i.e., the atom ratio a of Ag within a range of 0.2 or more and 0.4 or less. The test product 3 has the lamination cycle of 0.1 nm and deviates from the requirement of claim 1 of the present invention, i.e., the lamination cycle within a range of 0.2 nm or more and 100 nm or less. The test product 4 has the lamination cycle of 101.0 nm and deviates from the requirement of claim 1 of the present invention, i.e., the lamination cycle within a range of 0.2 nm or more and 100 nm or less. The test product 5 has the total film thickness of 10.1 μm and deviates from the requirement of claim 1 of the present invention, i.e., the total film thickness within a range of 0.2 μm or more and 10.0 μm or less. The test product 6 has the first film layer 24 comprising $Ag_{0.1}Cu_{0.9}$ and deviates from the requirement of claim 1 of the present invention, i.e., the atom ratio a of Ag within a range of 0.2 or more and 0.4 or less. The test product 7 has the first film layer 24 comprising $Ag_{0.5}Cu_{0.5}$ and deviates from the requirement of claim 1 of the present invention, i.e., the atom ratio a of Ag within a range of 0.2 or more and 0.4 or less. The test product 8 has the lamination cycle of 0.1 nm and deviates from the requirement of claim 1 of the present invention, i.e., the lamination cycle within a range of 0.2 nm or more and 100 nm or less, and has the total film thickness of 0.15 μm and deviates from the requirement of claim 1 of the present invention, i.e., the total film thickness within a range of 0.2 μm or more and 10.0 μm or less. The test product 9 has the total film thickness of 10.1 μm and deviates from the requirement of claim 1 of the present invention, i.e., the total film thickness within a range of 0.2 μm or more and 10.0 μm or less, and has the first film layer 24 comprising $Ti_{0.4}B_{0.6}ON$ and does not satisfy the requirement of claim 1 of the present invention, i.e., the first film layer comprising $Ag_aCu_{1-a}$. As apparent from the test results depicted in FIG. 6, it can be seen that all the test products 1 to 9 have the machined hole numbers less than 20 when the flank wear width is 0.2 mm and are inferior in cutting performance to the inventive products 1 to 14. It is considered that this is because a hard film not satisfying the requirement of claim 1 of the present invention has insufficient welding resistance and reaches the end of life earlier due to welding, peeling, etc.

As described above, this embodiment provides a multilayer film having the first film layer 24 comprising $Ag_aCu_{1-a}$ and the second film layer 26 comprising nitride, oxide, carbide, carbonitride, or boride containing at least one element out of group IVa elements, group Va elements, group VIa elements, Al, and Si alternately laminated in two or more layers; the atom ratio a related to the first film layer 24 is within a range of 0.2 or more and 0.4 or less; the lamination cycle d3 of the first film layer 24 and the second film layer 26 is within a range of 0.2 nm or more and 100 nm or less; and the total film thickness D is within a range of 0.2 µm or more and 10.0 µm or less; therefore, since Ag is contained in the film, friction coefficient and cutting resistance can be reduced; and a high hardness film excellent in lubricity and welding resistance can be provided. Thus, the hard film 22 can be provided as a cutting tool hard film excellent in both abrasion resistance and welding resistance.

This embodiment provides the drill 10 having the hard film 22 disposed as coating on a surface and, therefore, since Ag is contained in the film, friction coefficient and cutting resistance can be reduced, and a high hardness film excellent in lubricity and welding resistance is acquired. Thus, the drill 10 can be provided as a hard film coated cutting tool excellent in both abrasion resistance and welding resistance.

Although the preferred embodiment of the present invention has been described in detail with reference to the drawings, the present invention is not limited thereto and is implemented with various modifications applied within a range not departing from the spirit thereof.

NOMENCLATURE OF ELEMENTS

10: drill (hard film coated cutting tool) 12: cutting edge 14: shank 16: body 18: flutes 20: tool base material 22: hard film (cutting tool hard film) 24: first film layer 26: second film layer 30: sputtering apparatus 32: chamber 34: bias power source 36: controller 38: target 40: power source

The invention claimed is:

1. A cutting tool hard film disposed as a coating on a surface of a cutting tool,
the cutting tool hard film being a multilayer film comprising:
a first film layer comprising $Ag_aCu_{1-a}$, where a is within a range of 0.2 or more and 0.4 or less, and
a second film layer comprising one selected from the group consisting of a nitride, an oxide, a carbide, a carbonitride, and a boride, containing at least one element selected from the group consisting of group IVa elements, group Va elements, group VIa elements, Al, and Si, wherein:
the first film layer and the second film layer being laminated alternately in two or more layers,
a lamination cycle of the first film layer and the second film layer being within a range of 0.2 nm or more and 100 nm or less, and
a total film thickness being within a range of 0.2 µm or more and 10.0 µm or less.

2. A hard film coated cutting tool having the cutting tool hard film of claim 1 disposed as coating on a surface.

3. The cutting tool hard film of claim 1, wherein
a second film layer comprising one selected from the group consisting of a nitride, an oxide (except $MoO_3$), a carbide, a carbonitride, and a boride, containing at least one element selected from the group consisting of group IVa elements, group Va elements, group VIa elements, Al, and Si.

4. A hard film coated cutting tool having the cutting tool hard film of claim 3 disposed as coating on a surface.

* * * * *